(12) United States Patent
Nozu

(10) Patent No.: US 8,541,834 B2
(45) Date of Patent: Sep. 24, 2013

(54) SEMICONDUCTOR DEVICE AND METHOD FOR MANUFACTURING SAME

(75) Inventor: Tetsuro Nozu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/238,605

(22) Filed: Sep. 21, 2011

(65) Prior Publication Data

US 2012/0241849 A1 Sep. 27, 2012

(30) Foreign Application Priority Data

Mar. 24, 2011 (JP) ................................. 2011-066544

(51) Int. Cl.
*H01L 29/66* (2006.01)

(52) U.S. Cl.
USPC ........... 257/330; 257/331; 257/332; 257/302; 257/E27.091; 257/E29.198; 257/E29.201

(58) Field of Classification Search
USPC .................. 257/330, 331, 332, 302, E27.091, 257/E29.198, E29.201
See application file for complete search history.

(56) References Cited

U.S. PATENT DOCUMENTS

| | | | | |
|---|---|---|---|---|
| 6,677,641 | B2 * | 1/2004 | Kocon | 257/329 |
| 7,414,286 | B2 * | 8/2008 | Hirler et al. | 257/328 |
| 2007/0138544 | A1 * | 6/2007 | Hirler et al. | 257/330 |

FOREIGN PATENT DOCUMENTS

| | | |
|---|---|---|
| JP | 2004-502306 A | 1/2004 |
| JP | 2009-099872 | 5/2009 |

\* cited by examiner

*Primary Examiner* — N Drew Richards
*Assistant Examiner* — Ratisha Mehta
(74) *Attorney, Agent, or Firm* — Patterson & Sheridan, LLP

(57) ABSTRACT

According to one embodiment, a semiconductor device includes a first semiconductor region, a second semiconductor region, a third semiconductor region, a control electrode, a first main electrode, an internal electrode, and an insulating region. The control electrode is provided inside a trench. The first main electrode is in conduction with the third semiconductor region. The internal electrode is provided in the trench and in conduction with the first main electrode. The insulating region is provided between an inner wall of the trench and the internal electrode. The internal electrode includes a first internal electrode part included in a first region of the trench and a second internal electrode part included in a second region between the first region and the first main electrode. A spacing between the first internal electrode part and the inner wall is wider than a spacing between the second internal electrode part and the inner wall.

7 Claims, 10 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2011-066544, filed on Mar. 24, 2011; the entire contents of which are incorporated herein by reference.

FIELD

Embodiments described herein relate generally to a semiconductor device and a method for manufacturing the same.

BACKGROUND

In semiconductor devices, due to the demand for achieving an increase in efficiency and saving more energy, there is a need to achieve a decrease in size, an increase in breakdown voltage, and a decrease in ON-resistance. For example, in a trench gate MOSFET (Metal Oxide Semiconductor Field Effect Transistor), in applying a voltage between the source and drain, the breakdown voltage is secured by depleting a drift layer. In semiconductor devices, a further improvement in the breakdown voltage is desired while maintaining a low ON-resistance.

BRIEF DESCRIPTION OF THE DRAWINGS

FIG. 4A to FIG. 5B are schematic views illustrating trenches and electric field distributions;

DETAILED DESCRIPTION

Figure 1:
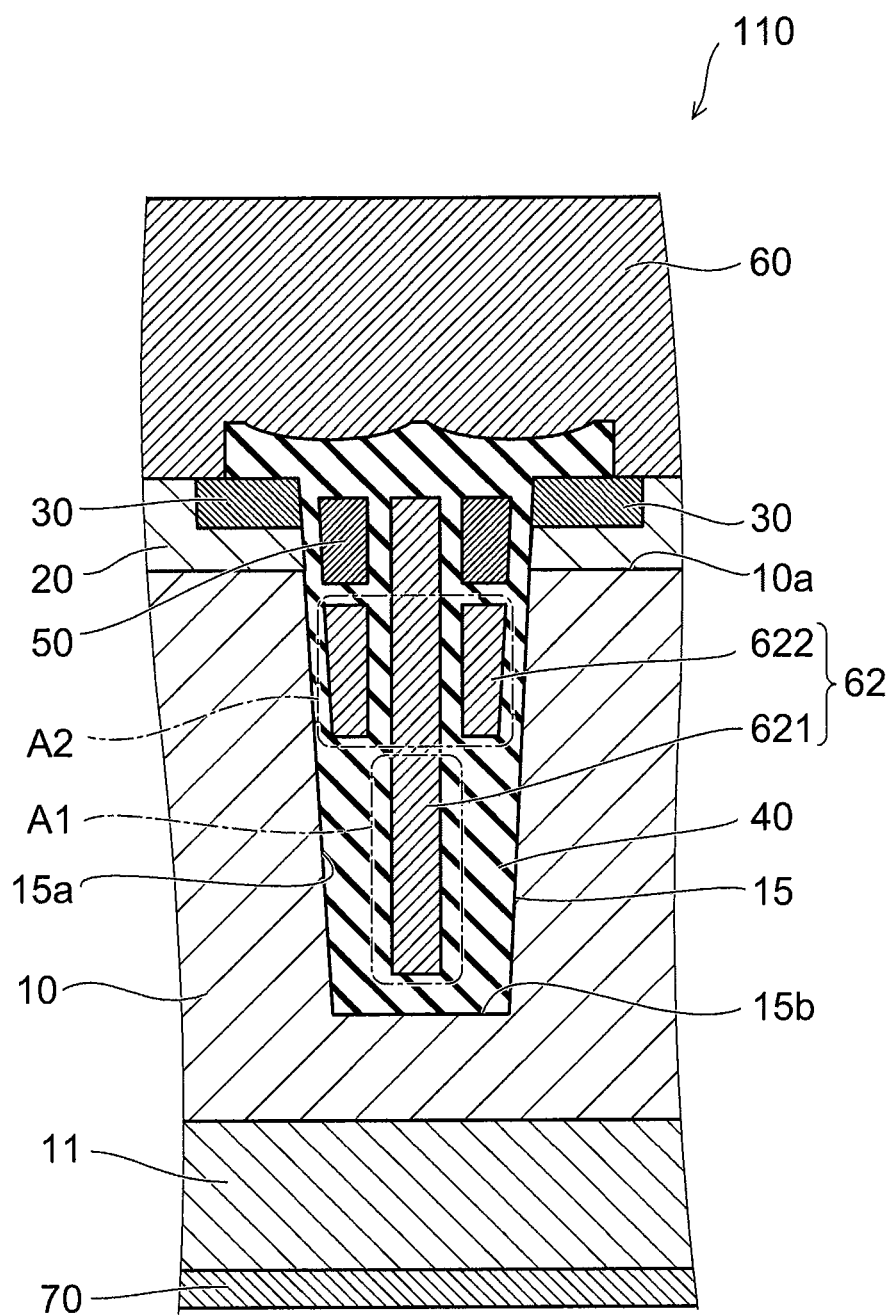
FIG. 1 is a schematic view illustrating the configuration of a semiconductor device according to a first embodiment.

In general, according to one embodiment, a semiconductor device includes a first semiconductor region of a first conductivity type, a second semiconductor region of a second conductivity type, a third semiconductor region of the first conductivity type, a control electrode, a first main electrode, an internal electrode, and an insulating region. The second semiconductor region is provided on a major surface of the first semiconductor region. The third semiconductor region is provided on the second semiconductor region. The control electrode is provided inside a trench penetrating the third semiconductor region and the second semiconductor region to reach the first semiconductor region. The control electrode extends in a first direction along the major surface. The first main electrode is in conduction with the third semiconductor region and provided outside the trench. The internal electrode is in conduction with the first main electrode and spaced apart from the control electrode inside the trench. The insulating region is provided between an inner wall of the trench and the first main electrode and between the inner wall of the trench and the internal electrode. The internal electrode includes a first internal electrode part and a second internal electrode part. The first internal electrode part is provided in a first region on a bottom face side of the trench relative to the control electrode and is inside the trench. The second internal electrode part is provided in a second region between the first region and the first main electrode and is inside the trench. In a direction along the major surface, in a second direction perpendicular to the first direction, a spacing between the first internal electrode part and the inner wall of the trench is wider than a spacing between the second internal electrode part and the inner wall of the trench.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for the same portions.

In the specification and the drawings of the application, components similar to those described in regard to a drawing thereinabove are marked with like reference numerals, and a detailed description is omitted as appropriate.

In the following description, as one example, a specific example is taken wherein a first conductivity type is an n-type and a second conductivity type is a p-type.

First Embodiment

FIG. 1 is a schematic view illustrating the configuration of a semiconductor device according to a first embodiment.

Figure 2:
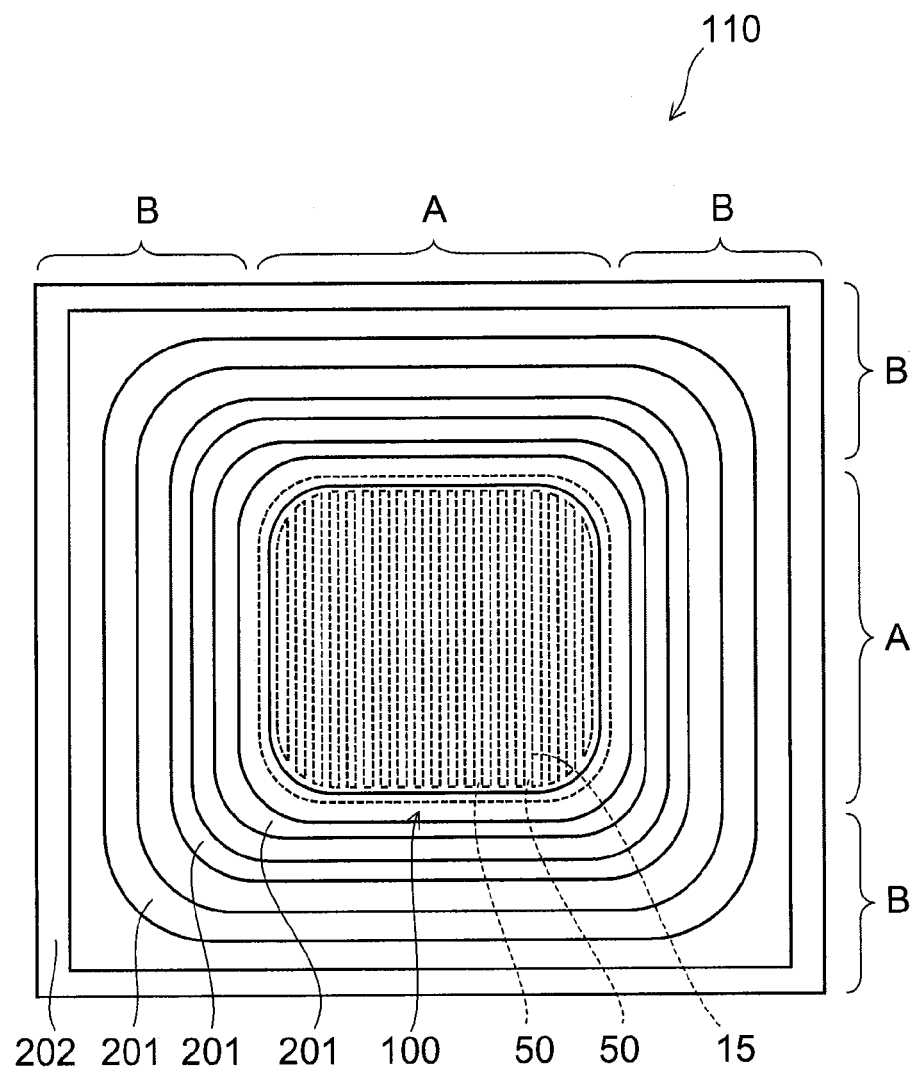
FIG. 2 is a schematic plan view of the semiconductor device according to the first embodiment.

FIG. 2 is a schematic plan view of the semiconductor device according to the first embodiment.

First, with reference to FIG. 2, the planar configuration of a semiconductor device 110 according to the embodiment is described.

As shown in FIG. 2, the semiconductor device 110 includes a cell region A and a termination region B surrounding the cell region A. The cell region A includes an element part 100 functioning as a semiconductor element. A control electrode 50 of the device element 100 extends along a major surface in the cell region A.

Here, the direction along which the control electrode 50 extends is referred to as a Y-axis direction (a first direction). The direction along the major surface and perpendicular to the Y direction is referred to as an X-axis direction (a second direction). The direction perpendicular to the X-axis and the Y-axis is referred to as a Z-axis direction (a third direction). In the Z-axis direction, the direction from a first semiconductor region 10 toward a second semiconductor region 20 is referred to as the upward (upper) direction and the direction opposite thereto is referred to as the downward (lower) direction.

In the cell region A, a plurality of control electrodes 50 are formed at predetermined spacings in the X-axis direction. The control electrode 50 is provided in a trench 15 extending in the Y-axis direction. While one control electrode 50 is shown in one trench 15 in the example shown in FIG. 2, a plurality of (e.g., two) control electrodes 50 may be provided in one trench 15.

A guard ring electrode 201 is provided in the termination region B. The guard ring electrode 201 is provided so as to surround the periphery of the cell region A. A plurality of guard ring electrodes 201 are provided as required. On the outer side of the outermost peripheral guard ring electrode 201, an EQPR (Equivalent Potential Ring) electrode 202 is provided.

Next, with reference to FIG. 1, a cross-sectional structure of the semiconductor device 110 according to the embodiment is described.

FIG. 1 shows a cross section of a part of the control electrode 50 illustrated in FIG. 2, the part being cut in the X-axis direction and viewed in the Y-axis direction.

The semiconductor device 110 includes the first semiconductor region 10 of a first conductivity type, the second semiconductor region 20 of a second conductivity type, a third semiconductor region 30 of the first conductivity type, the control electrode 50, a first main electrode 60, an internal electrode 62, and an insulating region 40.

The semiconductor device 110 according to the embodiment is a trench gate MOSFET.

The first semiconductor region 10 is an n-type drift layer, for example. The first semiconductor region 10 is formed on a substrate 11 made from an $n^+$-type silicon (with an impurity concentration higher than an n-type), for example.

The second semiconductor region 20 is provided on a major surface 10a of the first semiconductor region 10. The second semiconductor region 20 is a p-type base layer, for example.

The third semiconductor region 30 is provided on the second semiconductor region 20. The third semiconductor region 30 is an $n^+$-type source layer, for example.

The trench 15 is formed in the first semiconductor region 10, the second semiconductor region 20, and the third semiconductor region 30. The trench 15 is provided from the third semiconductor region 30 to the middle of the first semiconductor region 10 along the Z-axis direction.

The control electrode 50 is a gate electrode, for example. The control electrode 50 is provided in the trench 15 and extends along the Y-axis direction. In the semiconductor device 110 illustrated in FIG. 1, two control electrodes 50 are provided inside one trench 15. The control electrode 50 is disposed facing a part exposed from an inner wall 15a of the trench 15 in the second semiconductor region 20. The insulating region 40 is provided between the control electrode 50 and the inner wall 15a of the trench 15. The insulating region 40 functions as a gate insulating film.

The first main electrode 60 is a source electrode, for example. The first main electrode 60 conducts with the third semiconductor region 30 and is provided outside the trench 15. That is, the first main electrode 60 is provided on the trench 15 and is separated from the control electrode 50 via the insulating region 40.

The internal electrode 62 conducts with the first main electrode 60. That is, the internal electrode 62 has the same potential as the first main electrode 60. The internal electrode 62 is spaced apart from the control electrode 50 in the trench 15. The internal electrode 62 includes a part provided on a bottom face 15b side of the trench 15 relative to the control electrode 50 in the trench 15. The internal electrode 62 extends in the Y-axis direction while maintaining a spacing from the control electrode 50 in the trench 15.

In the semiconductor device 110, the internal electrode 62 includes a first internal electrode part 621 and a second internal electrode part 622.

The first internal electrode part 621 is provided in a first region A1 on the bottom face 15b side of the trench 15 relative to the control electrode 50 in the trench 15.

The second internal electrode part 622 is provided in a second region A2 between the first region A1 and the control electrode 50 in the trench 15.

In the internal electrode 62 illustrated in FIG. 1, the first internal electrode part 621 is formed with a first length from the position of the control electrode 50 to the bottom face 15b side of the trench 15 relative to the position of the second internal electrode part 622 in the Z-axis direction. The first internal electrode part 621 is disposed in the center part in the trench 15, for example. Accordingly, a part on the bottom face 15b side of the first internal electrode part 621 is included in the first region A1.

The second internal electrode part 622 is formed with a second length shorter than the first length in the Z-axis direction. The second internal electrode part 622 is disposed between the first internal electrode part 621 and the inner wall 15a of the trench 15 in the second region A2.

In the trench 15, the second internal electrode part 622 is spaced apart from the first internal electrode part 621.

In the semiconductor device 110 illustrated in FIG. 1, the second internal electrode part 622 is provided between each of the inner walls 15a of the trench 15 and the first internal electrode part 621, the inner walls 15a facing each other in the X-axis direction.

Moreover, in the semiconductor device 110, a second main electrode 70 is provided on the lower side of the substrate 11, for example. The second main electrode 70 is a drain electrode, for example.

In the semiconductor device 110 according to the embodiment, in the Y-axis direction, a spacing between the first internal electrode part 621 and the inner wall 15a of the trench 15 is wider than a spacing between the second region A2 and the inner wall 15a of the trench 15. Thus, in the electric field in the trench 15 in contact with the first semiconductor region 10 (n-type drift layer), three or more local maximal values of a component parallel to the trench 15 (component in the Z-axis direction) will be generated. The breakdown voltage is determined by the integral value of an electric field strength along the Z-axis direction. Accordingly, when three or more local maximal values are generated as described above, the integral value of an electric field strength increases as compared with the case where the number of the local maximal values is two, and thus the breakdown voltage can be increased.

Figure 3:
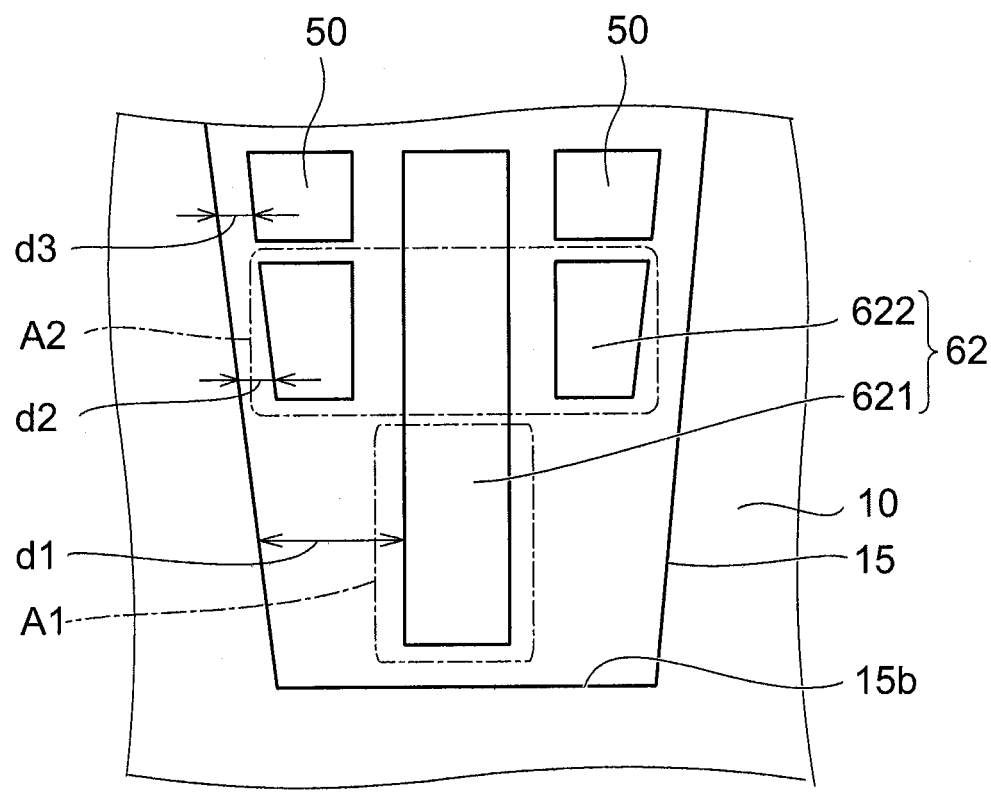
FIG. 3 is a schematic view describing spacings between the internal electrodes and the trench.

FIG. 3 is a schematic view describing spacings between the internal electrodes and the trench.

In FIG. 3, a cross section of the trench viewed in the Y-axis direction is schematically shown.

In the following description using FIG. 3, the second internal electrode part 622 on one side of the first internal electrode part 621 is described as an example, but the second internal electrode part 622 of the other side is also the same.

In FIG. 3, a spacing along the X-axis direction between the first internal electrode part 621 in the first region A1 and the inner wall 15a of the trench 15 is denoted by a spacing d1.

A spacing along the X-axis direction between the second internal electrode part 622 in the second region A2 and the inner wall 15a of the trench 15 is denoted by a spacing d1.

A spacing along the X-axis direction between the control electrode 50 and the inner wall 15a of the trench 15 is denoted by a spacing d3. Here, the spacing d3 corresponds to the thickness of the gate insulating film.

In the semiconductor device 110, the spacing d1 is wider than the spacing d2. Moreover, the spacing d2 is not less than the spacing d3.

Here, the spacings d1 and d2 may stepwisely or continuously vary with positions in the Z-axis direction.

When the spacings d1 and d2 vary with positions in the Z-axis direction, the respective average values shall be referred to as the spacings d1 and d2.

In the semiconductor device 110, the spacing d1 is wider than the spacing d2 even when the spacings d1 and d2 vary with positions in the Z-axis direction or even when they are constant.

In the semiconductor device 110 provided with such an internal electrode 62, when a voltage Vds (Vds>0 volt (V)) is applied between the first main electrode 60 which is the source electrode and the second main electrode 70 which is the drain electrode, a depletion layer will extend into the first semiconductor region 10 (n-type drift layer) facing the internal electrode 62. The depletion layer connects from the second semiconductor region 20 (p-type base layer) to the region facing the internal electrode 62 in the first semiconductor region 10. As a result, a finite electric field distribution is generated across a sufficiently long distance in the direction (Z-axis direction) along the trench 15. The voltage which is the integral value of this electric field strength is the breakdown voltage.

In the embodiment, because the spacing d1 of the internal electrode 62 is wider than the spacing d2, three or more local maximal values of a component in the Z-axis direction of this electric field distribution will be generated. In this manner, by the increase in the number of the local maximal values, the breakdown voltage determined by the integral value of the electric field strength is improved.

Figures 4A, 4B:
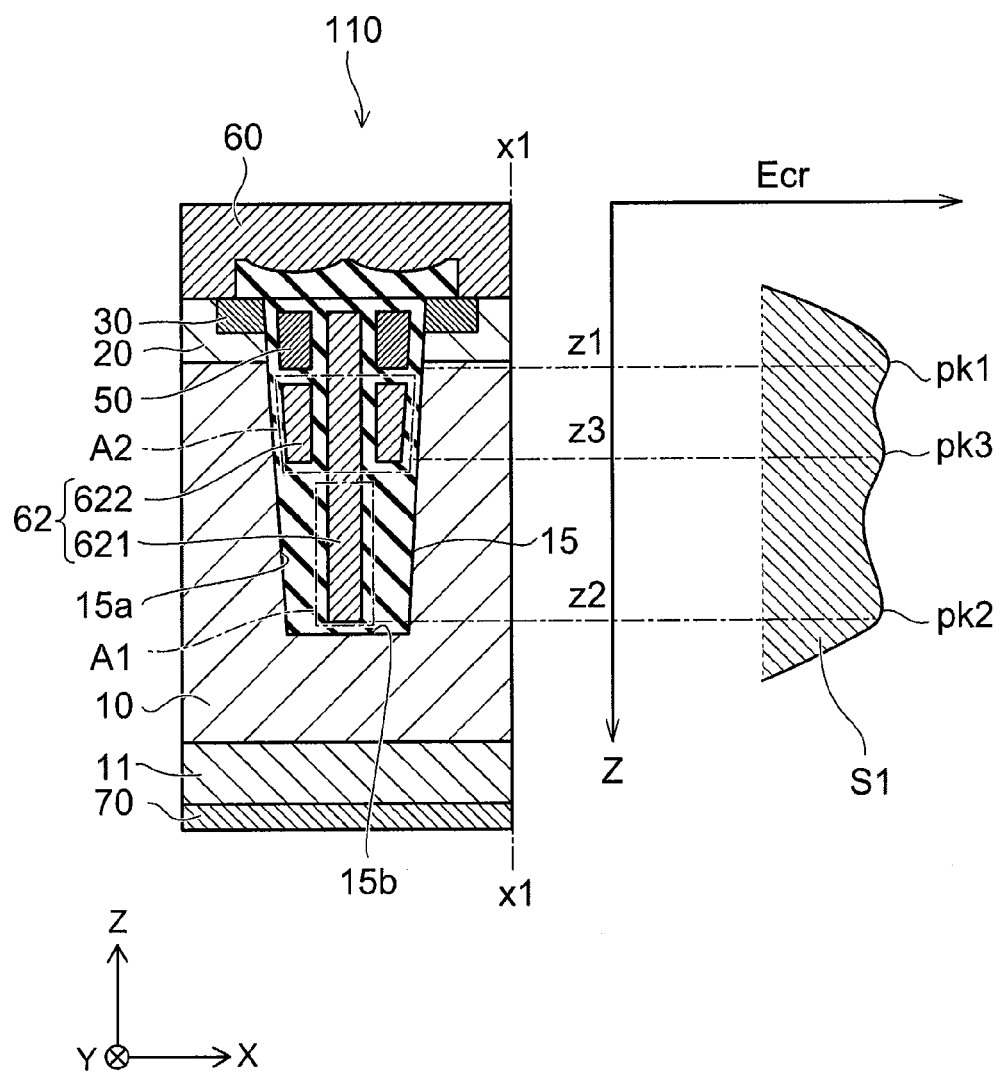
Figures 5A, 5B:
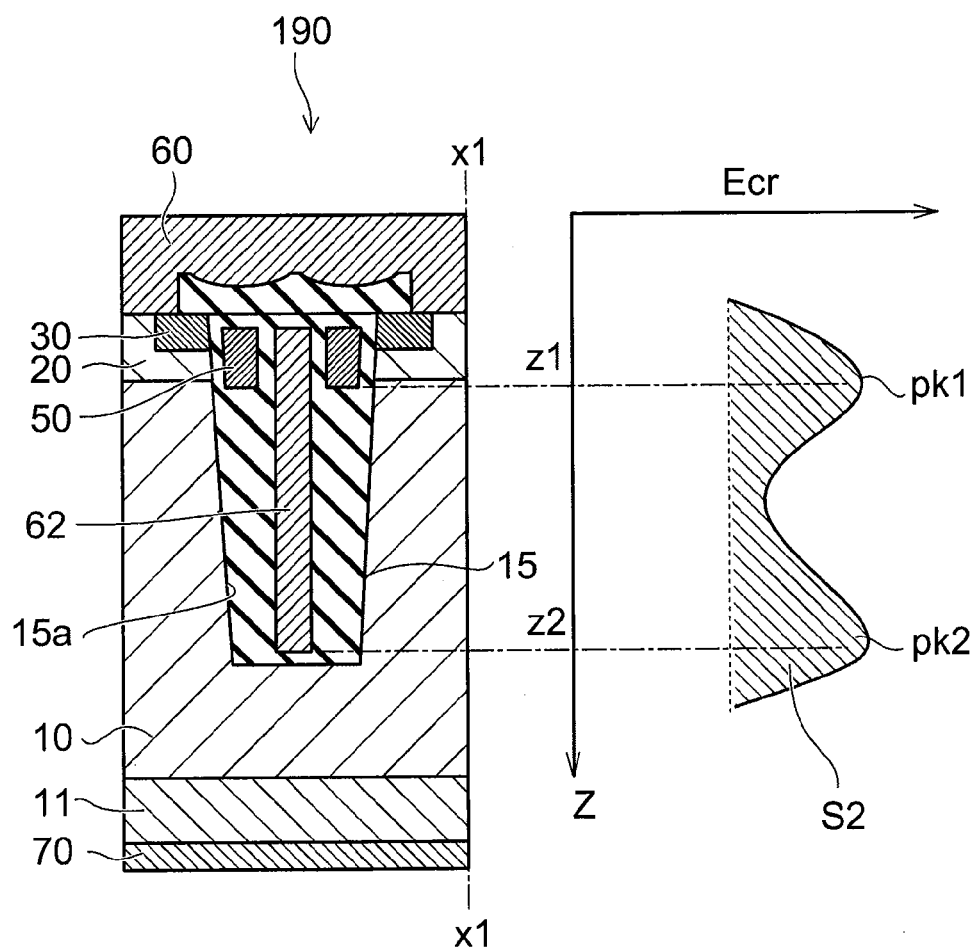

FIG. 4B and FIG. 5B are schematic views illustrating electric field distributions.

FIG. 4B illustrates the electric field distribution in the semiconductor device 110 according to the embodiment.

FIG. 5B illustrates the electric field distribution in a semiconductor device 190 according to a reference example.

FIGS. 4A and 5A each show a schematic cross sectional view of the semiconductor device, and FIGS. 4B and 5B each show an electric field strength Ecr in the depth direction (Z-axis direction) at a position x1 of the semiconductor device when a voltage Vds (Vds>0V) is applied.

Here, in the semiconductor device 190 according to the reference example shown in FIG. 5A, the second internal electrode part 622 of the semiconductor device 110 of the embodiment shown in FIG. 4A is not provided. Other configurations are the same as those of the semiconductor device 110.

As shown in FIGS. 5A and 5B, in the semiconductor device 190 according to the reference example, an electric field concentrates at a position z1 corresponding to the lower end of the control electrode 50 which is the gate electrode and at a position z2 corresponding to the lower end of the internal electrode 62. Accordingly, a peak pk1 in the electric field distribution is generated at the position z1 and a peak pk2 of the electric field strength is generated in a position z2. When two peaks pk1 and pk2 are generated in this manner, a valley of the electric field strength is generated between two peaks pk1 and pk2. The integral value of the electric field strength in the semiconductor device 190 is denoted by S2.

In contrast, as shown in FIGS. 4A and 4B, in the semiconductor device 110 according to the embodiment, as with the semiconductor device 190, an electric field concentrates at the position z1 corresponding to the lower end of the control electrode 50 which is the gate electrode and at the position z2 corresponding to the lower end of the internal electrode 62, but the electric field concentrates also at a position z3 corresponding to the lower end of the second internal electrode part 622.

In the semiconductor device 110, because the second internal electrode part 622 is provided at the position where the valley of the electric field is generated, the electric field strength can be increased also at the position z3. Accordingly, in the semiconductor device 110, two peaks pk1 and pk2 are generated at the positions z1 and z2 and at the same time the peak pk3 is generated also at the position z3 which is located between the positions z1 and z2. These three peaks pk1, pk2, and pk3 suppress the valley of the electric field strength. Denoting the integral value of the electric field strength in the semiconductor device 110 by S1, the integral value S1 is larger than the integral value S2 of the electric field strength in the semiconductor device 190. Accordingly, in the semiconductor device 110, the breakdown voltage can be improved as compared with the semiconductor device 190.

According to the analysis of the inventor, it was found that in the semiconductor device 110 a significant effect can be obtained in the specification of the breakdown voltage not less than 100 V.

That is, as with the semiconductor device 190, in a structure wherein two peaks pk1 and pk2 are generated in the electric field distribution and a valley is generated between the peaks pk1 and pk2, an increase in breakdown voltage is achieved by optimizing the impurity concentration of the first semiconductor region 10 (n-type drift layer) and increasing the film thickness of the first semiconductor region 10. Here, if the film thickness of the first semiconductor region 10 is increased in order to achieve the increase in breakdown voltage, the distance between both peaks pk1 and pk2 in the electric field distribution increases and the electric field strength of the valley decreases, and thus the breakdown voltage which is the integral value S2 of the electric field strength cannot be sufficiently improved.

In contrast, as with the semiconductor device 110 of the embodiment, the generation of three peaks pk1, pk2, and pk3 in the electric field distribution suppresses the valley, and thus the integral value S1 can be increased. Thus, a sufficient breakdown voltage can be obtained.

In the semiconductor device 110 according to the embodiment, when the impurity concentration of the first semiconductor region 10 which is the n-type drift layer is set to $2.5 \times 10^{16}$ cm$^{-3}$, the ON-resistance per unit area of 30 milliohms (mΩ) mm$^2$ and the breakdown voltage of 115 V can be obtained.

Here, in the semiconductor device 190, if the impurity concentration and the film thickness of the first semiconductor region 10 are optimized in order to obtain the same breakdown voltage 115 V as that of the semiconductor device 110, the ON-resistance per unit area becomes 40 mΩmm$^2$.

In the semiconductor device 110 according to the embodiment, even if the impurity concentration of the first semiconductor region 10 which is the n-type drift layer is set to be high, an effective depletion layer can be formed in the first semiconductor region 10 and a MOSFET with a high breakdown voltage and a low ON-resistance can be provided.

Second Embodiment

Next, a second embodiment is described. The second embodiment is a method for manufacturing a semiconductor device 110.

FIG. 6A to FIG. 8B are schematic cross sectional views illustrating the method for manufacturing the semiconductor device.

Figure 6A:
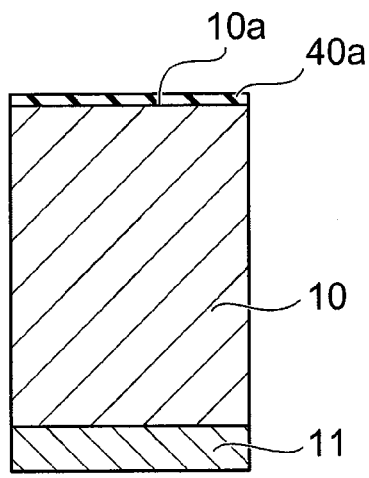
FIG. 6A to FIG. 8F are schematic cross sectional views illustrating a method for manufacturing a semiconductor device.

First, as shown in FIG. 6A, the first semiconductor region 10 is formed on the substrate 11. The substrate 11 is an n$^+$-type silicon (As concentration: $2 \times 10^{19}$ cm$^{-3}$), for example. Subsequently, a thermal oxidation film 40a is formed with a thickness of 500 nanometers (nm) in the major surface 10a of the first semiconductor region 10.

Figure 6B:
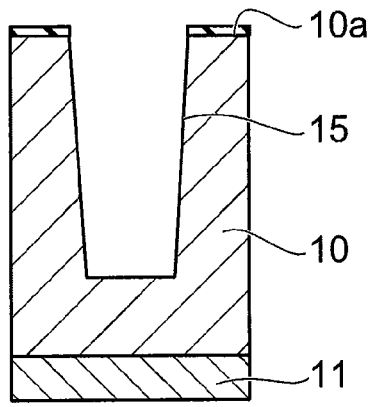

Next, as shown in FIG. 6B, the trench 15 is formed on the major surface 10a side of the first semiconductor region 10. That is, on the major surface 10a side of the first semiconductor region 10, a resist (not shown) is formed and an opening is provided at a position where the trench 15 is formed. Then, with the resist as a mask, the first semiconductor region 10 is etched by RIE (Reactive Ion Etching), for example, to form the trench 15. Subsequently, the resist is stripped. The width along the X-axis direction of the trench 15 is approximately one micrometer (μm). Moreover, the pitch along the X-axis direction when a plurality of trenches 15 are formed is approximately 2.8 μm.

Figure 6C:
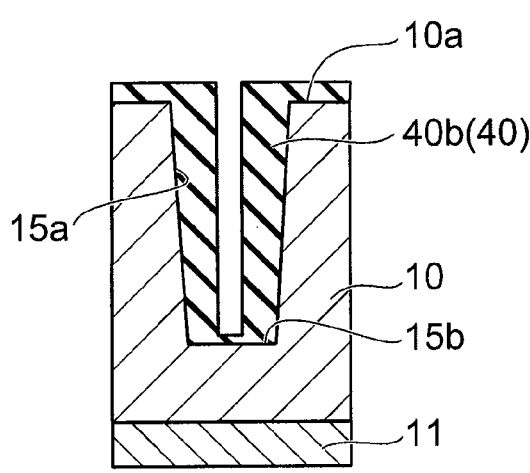
Figure 6D:
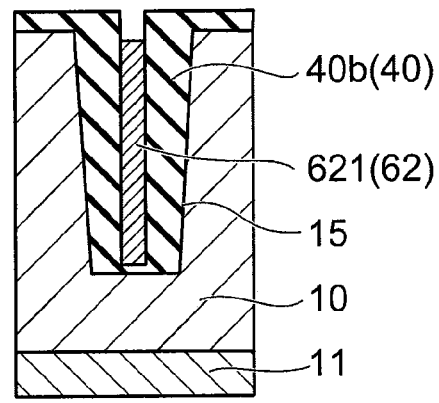

Then, as shown in FIG. 6C, the insulating region 40 made from the thermal oxidation film 40b is formed in the major surface 10a of the first semiconductor region 10 and in the inner wall 15a and the bottom face 15b of the trench 15. The thickness of the thermal oxidation film 40b in the trench 15 will be the spacing d1. Next, as shown in FIG. 6D, the first internal electrode part 621 is formed in the trench 15 via the insulating region 40 made from the thermal oxidation film 40b. For the first internal electrode part 621, polysilicon is used, for example.

Figure 6E:
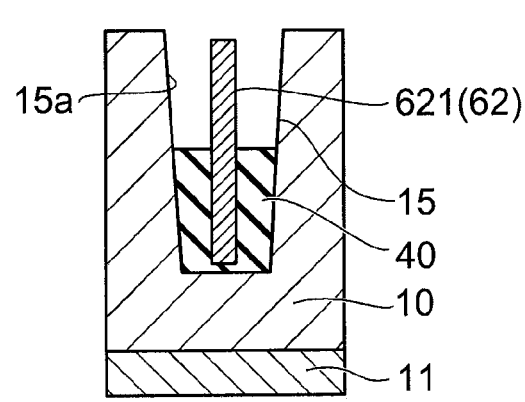

Subsequently, as shown in FIG. 6E, a part of the thermal oxidation films 40b is etched. This etching removes the thermal oxidation film 40b from the major surface 10a of the first semiconductor region 10 to the middle of the inner wall 15a of the trench 15. Because the first internal electrode part 621 is not etched, a part of the upper side is exposed.

Figure 6F:
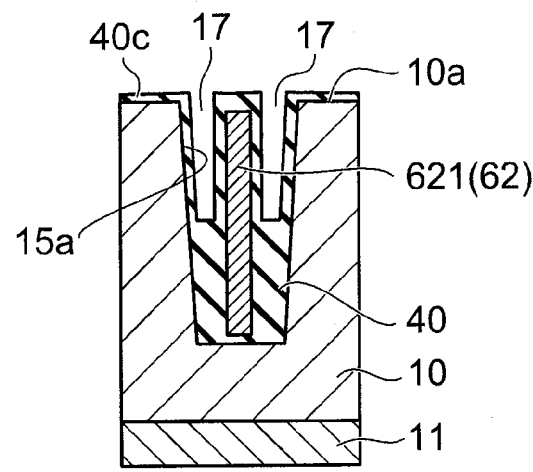

Next, as shown in FIG. 6F, a thermal oxidation film 40c is formed in the major surface 10a of the first semiconductor region 10, and in the exposed part of the inner wall 15a of the trench 15, and in the exposed part of the first internal electrode part 621. On both sides of the first internal electrode part 621, a concave part 17, where the thermal oxidation film 40c has not been formed, is left. The thickness of the thermal oxidation film 40c in the concave part 17 becomes the spacing d2.

Figure 7A:
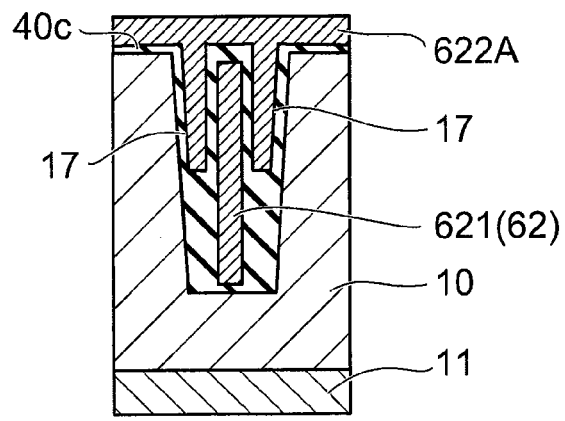

Then, as shown in FIG. 7A, a conductive film 622A is formed in the concave part 17. The conductive film 622A is a material to later serve as the second internal electrode part 622. For the conductive film 622A, polysilicon is used, for example.

Figure 7D:
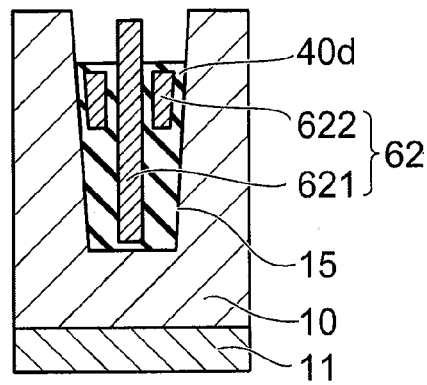
Figure 7B:
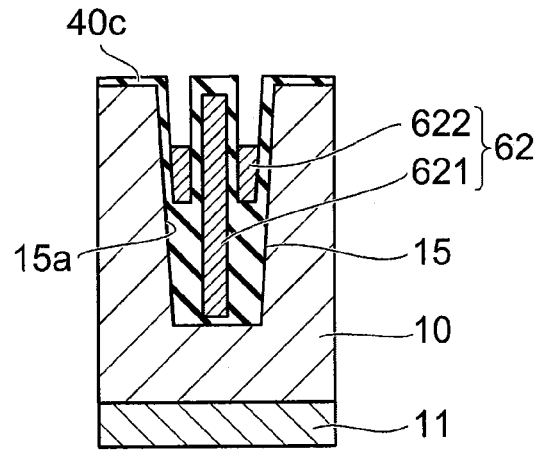

Subsequently, as shown in FIG. 7B, the conductive film 622A is etched to form the second internal electrode part 622. The thermal oxidation film 40c formed in the previous process is interposed between the second internal electrode part 622 and the inner wall 15a of the trench 15. Accordingly, the thickness of the thermal oxidation film 40c will be the spacing d2.

Figure 7E:
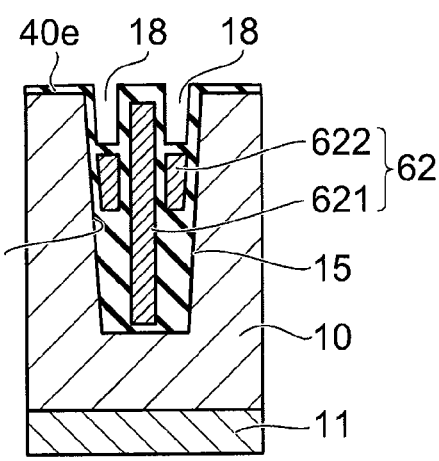
Figure 7C:
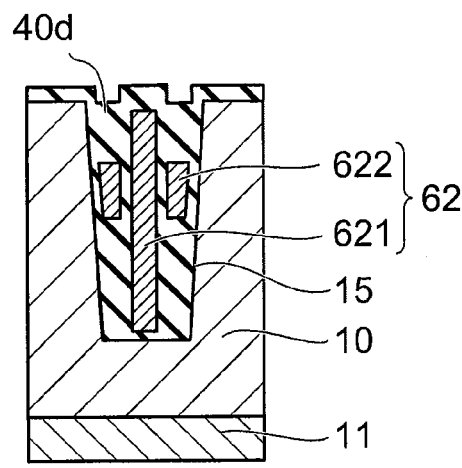

Next, as shown in FIG. 7C, an oxide film 40d is formed on the second internal electrode part 622. As the oxide film 40d, a silicone oxide film formed by CVD (Chemical Vapor Deposition) is used, for example.

Then, as shown in FIG. 7D, the oxide film 40d on the second internal electrode part 622 is etched. This etching leaves a part of the oxide film 40d on the second internal electrode part 622. The film thickness of the remaining oxide film 40d will be the spacing between the second internal electrode part 622 and the control electrode 50 to be formed later. This spacing is not less than approximately 0.2 μm.

By setting the spacing between the second internal electrode part 622 and the control electrode 50 to be not less than approximately 0.2 μm, a capacitance between the second internal electrode part 622 and the control electrode 50 is reduced.

Subsequently, as shown in FIG. 7E, a thermal oxidation film 40e is formed in the exposed inner wall 15a of the trench 15 and in the surface of the first internal electrode part 621. The thermal oxidation film 40e formed in the inner wall 15a of the trench 15 serves as the gate oxide film. On both sides of the first internal electrode part 621, a concave part 18, where the thermal oxidation film 40e has not been formed, is left.

Figure 7F:
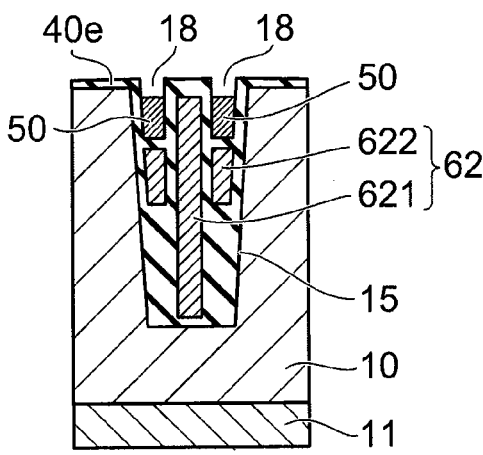

Next, as shown in FIG. 7F, the control electrode 50 is formed in the concave part 18. For the control electrode 50, polysilicon is used, for example.

Figure 8A:
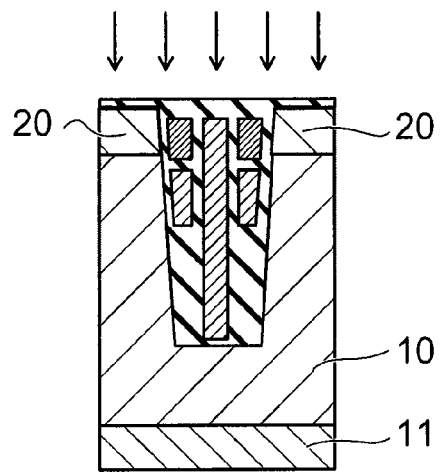

Then, as shown in FIG. 8A, the second semiconductor region 20 which is the base region is formed. That is, ion implantation is performed into the first semiconductor region 10, and the implanted impurity ion is diffused by annealing to form the second semiconductor region 20 which is a p-type base region.

Figure 8D:
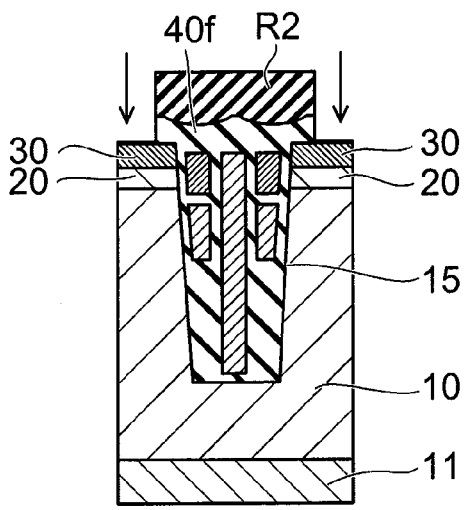
Figure 8B:
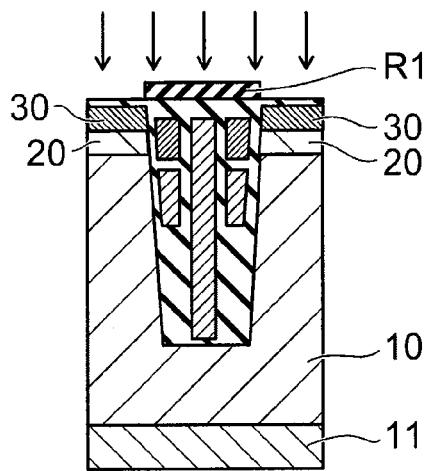

Next, as shown in FIG. 8B, a resist pattern R1 is formed on the trench 15, and through the use of the resist pattern R1 as a mask, ion implantation is performed. Thus, the third semiconductor region 30 which is an n-type source region is formed on the second semiconductor region 20. Subsequently, the resist pattern R1 is stripped.

Figure 8E:
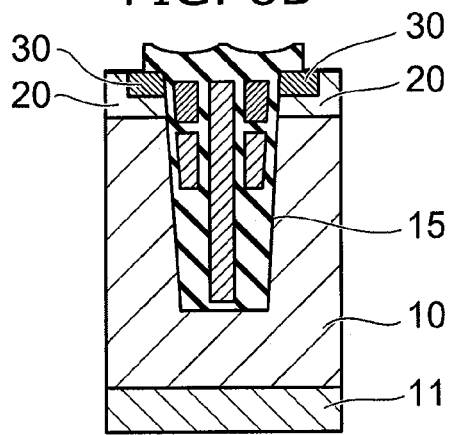
Figure 8C:
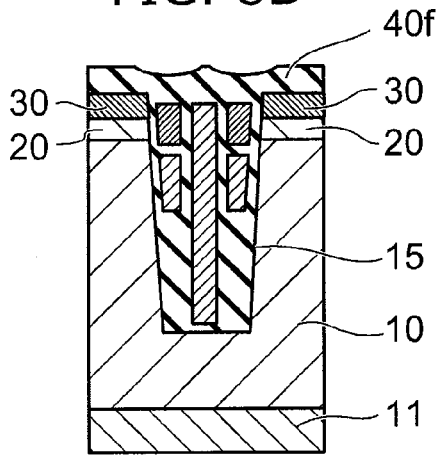

Then, as shown in FIG. 8C, an interlayer insulating film 40f is formed on the trench 15 and on the third semiconductor region 30. The interlayer insulating film 40f is formed at a thickness of 0.5 μm by CVD, for example.

Subsequently, as shown in FIG. 8D, a resist pattern R2 is formed on the interlayer insulating film 40f, and with the resist pattern R2 as a mask, a part of the interlayer insulating film 40f is etched. Then, ion implantation is performed for forming a contact layer in a part which is exposed by the interlayer insulating film 40f being etched. Subsequently, the resist pattern R2 is stripped.

Figure 8F:
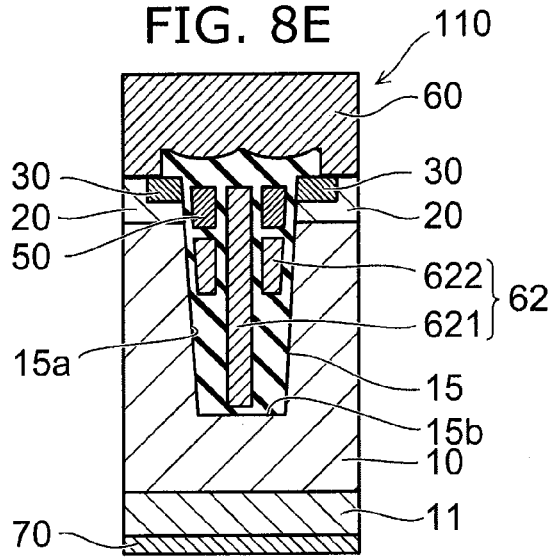

Next, as shown in FIG. 8E, an impurity ion, which has been ion-implanted in the previous process, is diffused by annealing. Then, as shown in FIG. 8F, the first main electrode 60 in conduction with the second semiconductor region 20 and the third semiconductor region 30 is formed. For the first main electrode 60, aluminum is used, for example. In addition, the second main electrode 70 is formed in the rear face of the substrate 11. After forming the electrode, an ohmic contact between the electrode and the semiconductor region is obtained by sintering. Thus, the semiconductor device 110 is completed.

The first internal electrode part 621 and the second internal electrode part 622 in the trench 15 can be formed easily in the semiconductor device 110 completed in this manner. Moreover, the spacing d1 between the first internal electrode part 621 and the inner wall 15a of the trench 15 and the spacing d2 between the second internal electrode part 622 and the inner wall 15a of the trench 15 can be set precisely.

Third Embodiment

Figure 9:
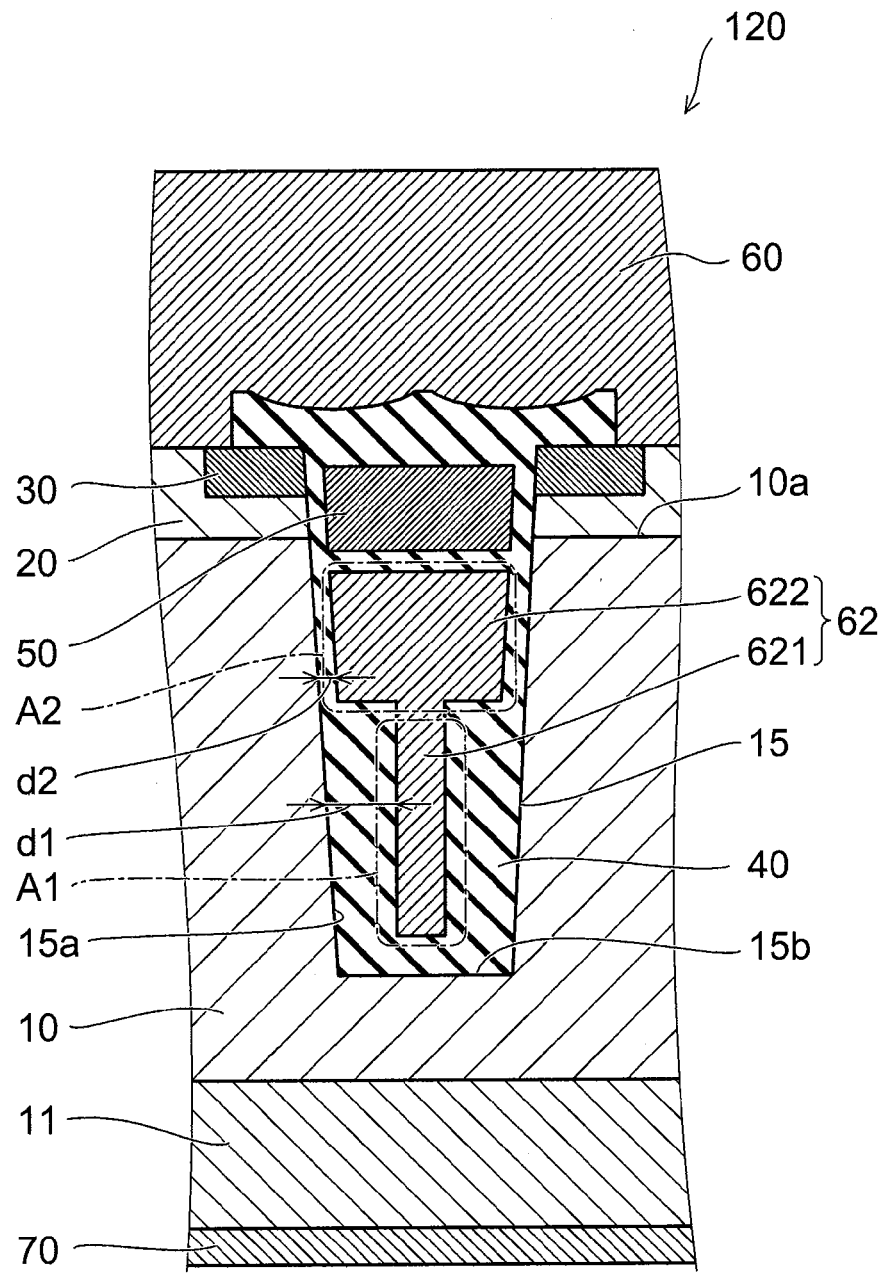
FIG. 9 is a schematic cross sectional view describing a semiconductor device according to a third embodiment.

FIG. 9 is a schematic cross sectional view describing a semiconductor device according to a third embodiment.

As shown in FIG. 9, in a semiconductor device 120 according to the third embodiment, the first internal electrode part 621 and the second internal electrode part 622 of the internal electrode 62 are integrally formed. That is, in the semiconductor device 120, the width along the X-axis direction of the second internal electrode part 622 is set to be wider than the width along the X-axis direction of the first internal electrode part 621. That is, the width of the integrally formed internal electrode 62 is wide on the near side of the control electrode 50 and narrow on the near side of the bottom face 15b of the trench 15. Thus, the spacing d1 between the first internal electrode part 621 and the inner wall 15a of the trench 15 is wider than the spacing d2 between the second internal electrode part 622 and the inner wall 15a of the trench 15.

As with the semiconductor device 110 according to the first embodiment, the spacing d2 is not less than the spacing d3.

Even with such a semiconductor device 120, the same electric field distribution as that of the semiconductor device 110 can be obtained. That is, when a voltage Vds (Vds>0 volt (V)) is applied between the first main electrode 60 which is the source electrode and the second main electrode 70 which is the drain electrode, three local maximal values of the component in the Z-axis direction of the electric field distribution are generated, as shown in FIGS. 4A and 4B. Thus, the breakdown voltage can be improved.

In the semiconductor device 120, the spacings d1 and d2 are set by the width of the first internal electrode part 621 and the width of the second internal electrode part 622 in the internal electrode 62. However, at least either one of the width of the first internal electrode part 621 and the width of the second internal electrode part 622 may gradually decrease (stepwisely or continuously narrow) from the control electrode 50 side to the bottom face 15b side of the trench 15. In this case, the respective averages of the spacing varying along the Z-axis direction shall be referred to as the spacings d1 and d2. Thus, the number of peaks in the electric field distribution can be further increased. In addition, depending on the setting of the spacings, a valley is not generated in the electric field distribution. Thus, the breakdown voltage can be further improved.

Fourth Embodiment

Figure 10:
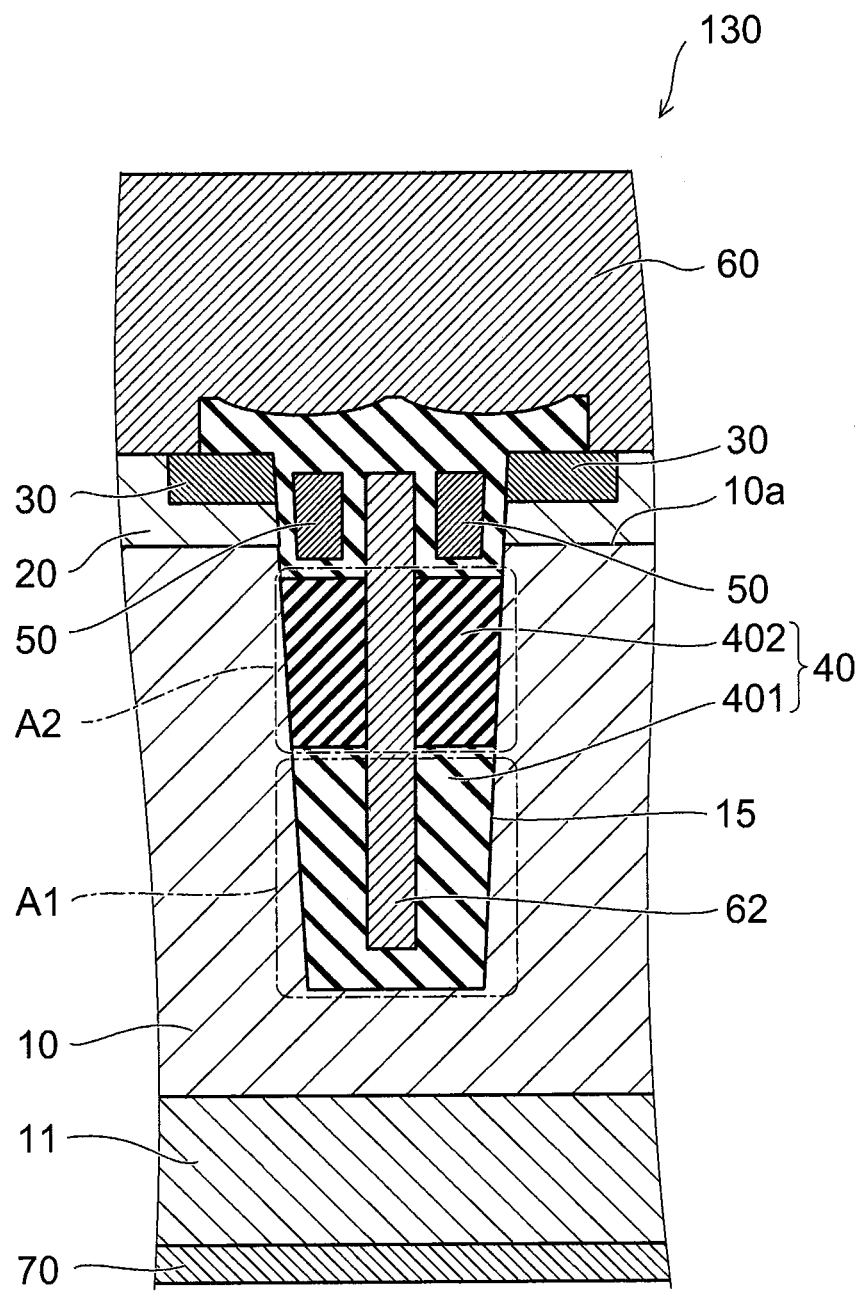
FIG. 10 is a schematic cross sectional view describing a semiconductor device according to a fourth embodiment.

FIG. 10 is a schematic cross sectional view describing a semiconductor device according to a fourth embodiment.

As shown in FIG. 10, in a semiconductor device 130 according to the fourth embodiment, the dielectric constant of the insulating region 40 provided between the internal electrode 62 and the inner wall 15a of the trench 15 is caused to vary from the first region A1 to the second region A2.

That is, the insulating region 40 in the trench 15 has a first insulating region 401 included in the first region A1 and a second insulating region 402 included in the second region A2. Then, the dielectric constant of the second insulating region 402 is set to be higher than the dielectric constant of the first insulating region 401.

Here, if the spacing between the internal electrode 62 and the inner wall 15a of the trench 15 is constant, then the higher the dielectric constant of the insulating region 40 interposed therebetween, the stronger the electric field strength shown in FIGS. 4A and 4B becomes. Accordingly, when the insulating region 40 with the same dielectric constant is used, the dielectric constant of a part in which the electric field strength becomes low between the control electrode 50 side and the bottom face 15b of the trench 15 in the internal electrode 62 is set to be higher than a part in which the electric field strength becomes high. Thus, a drop in the electric field strength can be suppressed.

In the semiconductor device 130 according to the fourth embodiment, by setting the dielectric constant of the second insulating region 402 to be higher than the dielectric constant of the first insulating region 401, the same electric field distribution as that of the semiconductor device 110 can be obtained. That is, when a voltage Vds (Vds>0 volt (V)) is applied between the first main electrode 60 which is the source electrode and the second main electrode 70 which is the drain electrode, three local maximal values of the component in the Z-axis direction of the electric field distribution are generated, as shown in FIGS. 4A and 4B. Thus, the breakdown voltage can be improved.

As with the semiconductor device 130, in order to cause the dielectric constant to vary with places of the insulating region 40, a part of the thermal oxidation film 40b is etched, and thus the thermal oxidation film 40b in the trench 15 is located below the opening of the trench 15, as shown in FIG. 6E. The remaining thermal oxidation film 40b serves as the first insulating region 401. Subsequently, on the remaining thermal oxidation film 40b, a material with a dielectric constant higher than the thermal oxidation film 40b is stacked. This stacked part serves as the second insulating region 402.

For example, if $SiO_2$ is used as the material of the first insulating region 401, then a material, such as alumina (e.g., $Al_2O_3$) or $HfO_2$ with a dielectric constant higher than $SiO_2$, is used as the material of the second insulating region 402.

The dielectric constant of the insulating region 40 may be set so as to gradually decrease from the control electrode 50 side toward the bottom face 15b side of the trench 15. In this case, the respective averages of the dielectric constant varying along the Z-axis direction shall be referred to as the dielectric constant of the first insulating region 401 and the dielectric constant of the second insulating region 402. Thus, the number of peaks in the electric field distribution can be further increased. In addition, depending on the setting of the dielectric constant, a valley is not generated in the electric field distribution. Thus, the breakdown voltage can be further improved.

As described above, with the semiconductor device and the method for manufacturing the same according to the embodiment, the breakdown voltage can be improved while maintaining a low ON-resistance.

Hereinabove, the embodiment and the variations are described. However, the invention is not limited to these examples. For example, one skilled in the art may suitably add or delete an element or perform a design change to each embodiment or variant thereof described above, or may suitably combine the features of each embodiment described above. Such practices are also included in the scope of the invention to the extent that the purport of the invention is included.

For example, in each embodiment and each variation described above, the description is made with the first conductivity type as an n-type and the second conductivity type as a p-type, but the invention can be practiced even when the first conductivity type is a p-type and the second conductivity type is an n-type.

Moreover, the invention can be applied to a MOSFET with a super junction structure not shown in the embodiment.

Furthermore, in each embodiment and each variation described above, a MOSFET using silicon (Si) as semiconductor is described, but as the semiconductor, a compound semiconductor, such as silicon carbide (SiC) or gallium nitride (GaN), or a wideband gap semiconductor, such as diamond, can be also used.

Furthermore, in each embodiment and each variation described above, the examples in the case of a MOSFET are shown, but other than this, the invention can be applied to even a mixed element of a MOSFET and an SBD (Schottky Barrier Diode) or to an element, such as an IGBT (Insulated Gate Bipolar Transistor), for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor region of a first conductivity type;
   a second semiconductor region of a second conductivity type provided on a major surface of the first semiconductor region;
   a third semiconductor region of the first conductivity type provided on the second semiconductor region;
   an insulating region penetrating the third semiconductor region and the second semiconductor region to reach the first semiconductor region;
   a first main electrode contacting the third semiconductor region and an upper surface of the insulating region;
   a first internal electrode part disposed in a center portion of the insulating region and in electrical contact with the first main electrode, the first internal electrode part extending within the insulating region from a portion adjacent to the third semiconductor region to a portion adjacent to the first semiconductor region;
   a second internal electrode part in electrical contact with the first main electrode and provided as two or more pieces with at least one piece provided on each side of the first internal electrode in the insulating region between the first internal electrode part and the first semiconductor region;
   a control electrode provided in the insulating region in a portion above the second internal electrode and adjacent to the first semiconductor region, the second semiconductor region, and the third semiconductor region, the control electrode extending within the insulating region from the portion adjacent to the third semiconductor region to reach the portion adjacent to the first semiconductor region.

2. The device according to claim 1, wherein
   the first internal electrode part extends a first length in a third direction that is perpendicular to the major surface, and
   the second internal electrode part extends a second length, which is shorter than the first length, in the third direction.

3. The device according to claim 1, wherein a spacing in a first direction, which is parallel to the major surface, between the second internal electrode part and the first semiconductor region is wider than a spacing in the first direction between the control electrode and the second semiconductor region.

4. The device according to claim 1, wherein at least three peaks are provided in a distribution of electric field strength inside the first semiconductor layer in a third direction perpendicular to the major surface when a voltage is applied to the control electrode.

5. The device according to claim 1, wherein the spacing in a second direction, which is parallel to the major surface, between the first internal electrode part and the first semiconductor region varies with position along a third direction perpendicular to the major surface.

6. The device according to claim 1, wherein the spacing in a second direction, which is parallel to the major surface, between the second internal electrode part and the first semiconductor region with position along a third direction perpendicular to the major surface.

7. The device according to claim 1, further comprising a second main electrode provided opposite to the major surface of the first semiconductor layer.

* * * * *